(12) United States Patent
Seal et al.

(10) Patent No.: US 7,218,223 B2
(45) Date of Patent: May 15, 2007

(54) MAGNETIC FIELD SENSING FOR TAMPER IDENTIFICATION

(75) Inventors: Brian Keith Seal, Westminister, SC (US); Brent Martin, Walhalla, SC (US)

(73) Assignee: Itron, Inc., Liberty Lake, WA (US)

( * ) Notice: Subject to any disclaimer, the term of this patent is extended or adjusted under 35 U.S.C. 154(b) by 0 days.

(21) Appl. No.: 11/037,891

(22) Filed: Jan. 18, 2005

(65) Prior Publication Data

US 2005/0122217 A1 Jun. 9, 2005

Related U.S. Application Data

(63) Continuation of application No. 10/209,177, filed on Jul. 31, 2002, now Pat. No. 6,885,302.

(51) Int. Cl.
*G08B 13/24* (2006.01)

(52) U.S. Cl. ............... 340/551; 340/552; 340/870.05; 340/537; 340/310.01; 324/72; 324/160; 324/110

(58) Field of Classification Search ............... 340/551, 340/552, 870.01, 870.02, 870.05, 637, 561, 340/310.01, 537; 324/110, 160, 72
See application file for complete search history.

(56) References Cited

U.S. PATENT DOCUMENTS

| | | | | |
|---|---|---|---|---|
| 3,500,365 A | * | 3/1970 | Cain | 340/870.32 |
| 4,019,135 A | * | 4/1977 | Lofdahl | 324/113 |
| 4,677,380 A | | 6/1987 | Popovic et al. | |
| 4,707,679 A | * | 11/1987 | Kennon et al. | 340/538 |
| 4,752,733 A | | 6/1988 | Petr et al. | |
| 4,996,870 A | * | 3/1991 | Deutsch | 73/1.28 |
| 5,086,292 A | * | 2/1992 | Johnson et al. | 340/637 |
| 5,473,322 A | * | 12/1995 | Carney | 340/870.02 |
| 5,486,755 A | * | 1/1996 | Horan et al. | 324/110 |
| 5,488,565 A | | 1/1996 | Kennon et al. | |
| 5,910,774 A | | 6/1999 | Capriotti et al. | |
| 6,073,169 A | | 6/2000 | Shuey et al. | |
| 6,373,399 B1 | | 4/2002 | Johnson et al. | |

\* cited by examiner

*Primary Examiner*—Daniel Wu
*Assistant Examiner*—Daniel Previl
(74) *Attorney, Agent, or Firm*—Dority & Manning PA

(57) ABSTRACT

The present technology involves a method and apparatus for detecting and reporting magnetic fields in the proximity of a utility meter as an approach to determining tampering of such meter. The sensitivity level of the magnetic field sensors may be adjustable allowing either remote or local sensitivity adjustments to a magnetic field sensor to compensate for variations in the electromagnetic environments of different meter installation sites. Alternatively, the output of each magnetic field sensor may be connected to the input of an adjustable threshold circuit. When the output voltage of the magnetic field exceeds a predetermined threshold voltage, a magnetic event signal is generated. Threshold adjustments to the adjustable threshold circuit may be performed locally at the meter site or remotely from a station. The output of each magnetic field sensor may be monitored by a locally or remotely programmable magnetic sensor output monitor. Such magnetic sensor output monitor generates a magnetic event signal when a predetermined number of magnetic sensors have been activated.

14 Claims, 4 Drawing Sheets

MAGNETIC FIELD SENSING FOR TAMPER IDENTIFICATION

PRIORITY CLAIM

This application is a CON of 10/209,177 filed Jul. 31, 2002 U.S. Pat. No. 6,885,302 which is incorporated herein by reference for all purposes.

BACKGROUND OF THE INVENTION

The present technology generally relates to a method and apparatus for detecting and reporting magnetic fields in the proximity of a utility meter, and, more particularly the use of such technology in the context of improved meter tampering detection. The magnetic field sensors are adjustable allowing either remote or local sensitivity/selectivity adjustments to compensate for variations in the electromagnetic environments of different meter installation sites.

Utility meters, including solid state and electro-mechanical meters, have been in use for many years to measure the consumption of resources such as water, gas and electricity. Electric utilities, for example, use such utility meters to generate data indicative of the consumption of electric energy, which data is used for billing purposes. Traditionally, meter reading personnel would periodically inspect a customer installation to look for signs of tampering with the utility meter and to record meter readings, either manually or with the use of electronic devices (such as probes or receivers). Billing to the customer is established based on such collected data. Today, however, it has become increasingly common for such meters to have the capability of communicating with a central communication station. Such capability is often used for Automatic Meter Reading (AMR) where billing data is read remotely, eliminating the need for on-site data retrieval. Consequently, as the number of AMR equipped utility meters has increased, there has been a corresponding decrease in on-site inspections of such utility meters.

One adverse result of the increased use of AMR equipped utility meters is the increased opportunity for undetected tampering with the metering equipment. Tampering with a meter, such as an electricity meter, is an effort to defraud the electricity supplier of revenue to which it is rightfully entitled for the delivery of electric energy. One method of tampering with a utility meter is to subject the meter to a magnetic field. Electromagnetics embraces both electricity and magnetism and is basic to everything electric and magnetic. Thus, all electronic devices, including utility meters, can be adversely affected by spurious electromagnetic energy. In fact, many of the components used in modern solid-state electricity meters are sensitive to externally applied magnetic fields. If such fields are strong enough, these fields can reduce or eliminate altogether the meter's ability to measure the consumed energy.

Most, if not all, utility meter manufacturers test their products for immunity/susceptibility to electromagnetic fields and design their products to meet minimum immunity requirements set by regulatory agencies (such as the European Union). Should a utility meter be subjected to electromagnetic fields or magnetic fields that exceed the level for which such meter is design to withstand, the utility meter could be adversely affected. For example, magnetic fields produced by a magnet can have adverse affects on the accuracy of a utility meter.

Electric utility meters often employ current transformers to sense the current being drawn through the meter. The presence of a strong magnetic field may cause errors to be induced within the current transformers. As is well known to those skilled in the art, the meter could gain energy or lose energy depending on how the spurious magnetic field lines are linked through the current transformer.

Similarly, the magnetic components (e.g. transformer or coupled inductor, depending on the power supply topology used) within the utility meter power supply are also susceptible to electromagnetic/magnetic fields. Should a magnetic field saturate the magnetic components within the power supply of a utility meter, the meter may power down allowing energy to flow unmeasured.

In the past, to prevent magnetic tampering, ferrous metal cores and shields were used to block the magnetic fields within utility meters. Such shields and cores may not be the ideal magnetic tampering prevention solution, however, as such shields and cores are expensive and difficult to incorporate into new meter assemblies. Instead of shielding the electronics of a utility meter, a better solution would be to detect the existence of electromagnetic fields within the proximity of a utility meter. Consequently, there is a need to detect magnetic fields in the proximity of a utility meter.

Numerous utility meter tampering detection methods are known to those skilled in the art of manufacturing utility meters. One such method is described in U.S. Pat. No. 5,473,322 issued on Dec. 5, 1995 to Carney which discloses a mechanical based tamper detection method. Carney '332 discloses a device for detecting tampering of a utility meter that includes sensors to detect a positional displacement of the meter coupled with loss of power to the meter. On sensing a positional displacement of the meter, indicative of an attempt to remove the meter, a timer is activated to enable sensing a power loss to the meter within a predetermined amount of time. Another meter tampering detection method is described in U.S. Pat. No. 4,707,679 issued on Nov. 17, 1987 to Kennon, et al. which discloses using magnetically sensitive switches to sense the presence of a strong magnetic field in the region of a electric meter. One problem with such magnetic tamper detection methods is that the sensitivity may not be adjusted without making hardware changes to the utility meter.

Notably, electromagnetic energy may be either a natural or human made phenomena. Natural sources of electromagnetic energy include thunderstorms, the magnetic fields produced by magnets, and lighting discharges, to name only three. Electric-power generators, faulty electric-power transformers, electric-power transmission lines, broadcast communication electronics, radar, electric tools, electric machines and automobile-ignition systems are among human made electromagnetic energy sources. Considering the diversity of electromagnetic energy sources, it is unlikely that any two utility meters will be installed in environments where the undesired ambient electromagnetic energy levels are precisely equal. Consequently, a need exists for a method and apparatus for detecting magnetic fields in the proximity of a utility meter that is electrically programmable or adjustable so to allow remote or local adjustments to compensate for variations in the level of ambient electromagnetic activity or "pollution" at different utility meter installation sites.

In addition, the sensitivity of some magnetic sensors, such as magnetic reed switches, are not normally adjustable once such sensors have been manufactured. By using two or more of such sensors to detect magnetic fields over a wider area, the selectivity of such devices can be improved. Consequently, there is a need for a method of improving the selectivity of such magnetic sensors.

BRIEF SUMMARY OF THE INVENTION

In view of the discussed drawbacks and shortcomings encountered in the field of utility metering, an improved system for detecting magnetic fields in the proximity of a utility meter has been developed. Thus, broadly speaking, a general object of the present subject matter is to provide required meter tamper detection through magnetic field detection. Another general object is to provide adjustable magnetic field meter tamper detection technology where the sensitivity/selectivity may be locally or remotely adjusted to compensate for variations in the ambient electromagnetic environment surrounding a utility meter.

It is another principle object of the disclosed technology to provide a magnetic field detection apparatus wherein a plurality of magnetic field sensors are oriented in a manner to enhance the ability to detect magnetic fields in three dimensions.

It is still yet another principle object of the disclosed technology to transfer magnetic sensor activation related data to a remote location. This transfer of data is accomplished using any type of well known transmitter/receiver technology, such as transmitter/receiver technology common in AMR equipped utility meters. Such aspect provides for remote detection of a magnetic field event.

A still further object of the disclosed technology is to transfer magnetic field apparatus adjustment data from a remote location to the utility meter. This transfer of data may also be accomplished using known transmitter/receiver technology, such as transmitter/receiver technology common in AMR equipped utility meters. Such aspect provides for remote adjustment/calibration of the magnetic field sensor technology.

Additional objects and advantages of the present subject matter are set forth in, or will be apparent to, those of ordinary skill in the art from the detailed description herein. Also, it should be further appreciated that modifications and variations to the specifically illustrated, referred and discussed features and steps hereof may be practiced in various embodiments and uses of the invention without departing from the spirit and scope thereof, by virtue of present reference thereto. Such variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of this invention may include various combinations or configurations of presently disclosed features or elements, or their equivalents (including combinations of features, parts, or steps or configurations thereof not expressly shown in the figures or stated in the detailed description of such figures). One exemplary such embodiment of the present subject matter relates to a magnetic field detection apparatus, including at least one magnetic field sensor with an adjustable sensitivity level. A plurality of adjustable magnetic field sensors may be used and oriented in a manner to enhance the ability to detect magnetic fields in three dimensions. Each adjustable magnetic field sensor (if plural are used in an embodiment) is connected to a processor for recording sensor activation related data when a magnetic field whose strength is detected above a given threshold level. The processor may be connected to transmitter/receiver technology common in AMR equipped meters. Such transmitter/receiver technology is well known to those skilled in the art. The transmitter/receiver technology is used to transmit data between a remote station and the processor, such data including sensor activation related data and sensor adjustment data.

Another present exemplary embodiment of the subject technology concerns a magnetic field detection apparatus where one or more magnetic field sensor outputs are connected to an adjustable threshold circuit. The adjustable threshold circuit is adjusted to vary the spurious magnetic field strength required to generate a magnetic field detection signal. One or more magnetic field sensors may be used and oriented in a manner to enhance the ability to detect magnetic fields in three dimensions. Each magnetic field sensor may be collectively connected to a single adjustable threshold circuit, or each magnetic field sensor may have an adjustable threshold circuit specifically dedicated for each magnetic field sensor. Each adjustable threshold circuit is connected to a processor for recording sensor activation related data when a magnetic field with strength beyond the respectively established threshold values is detected. As before, the processor may be connected to transmitter/receiver technology, such as technology common in AMR equipped meters. Such transmitter/receiver technology is well known to those skilled in the art. The transmitter/receiver technology is used to transmit data between a remote station and the processor, such data including sensor activation related data and threshold adjustment data.

Additional embodiments of the present subject matter concern corresponding methodology or other embodiments for detecting magnetic fields within the proximity of a utility meter. In some embodiments, the present claims are combined with the utility meter (e.g., a solid state meter, a electromechanical meter, or a hybrid solid state/electromechanical meter, or some other kind of utility meter—including electricity or non-electricity meters). A first step in an exemplary method is to position at least one magnetic field sensor devices with an adjustable sensitivity level within the utility meter. A second step is to provide a processor, wherein the processor is connected to each magnetic field sensor. Preferably, when a magnetic field sensor is exposed to a magnetic field with a field strength that exceeds a given level, the magnetic field sensor activates and the processor detects such activation. A third step in such exemplary method is to store magnetic event related data when the processor detects a magnetic field sensor activation. As before, the processor may be connected to transmitter/receiver technology. The transmitter/receiver technology is used to transmit data between a remote station and the processor, such data including magnetic event signal related data and magnetic field sensor programming/adjustment data.

A first step in a second exemplary method is to position at least two magnetic field sensor devices within the utility meter. For this exemplary method, the magnetic field sensors may or may not have adjustable sensitivity levels. A second step in such exemplary method is to provide a sensor output monitor that monitors the output of each magnetic field sensor device and detects when a magnetic sensor device has been activated. The sensor output monitor is connected to each magnetic sensor device and is preferably programmable or adjustable to generate a magnetic event signal when a minimum number of magnetic field sensor device activations have been detected. The sensor output monitor may be connected to a processor, wherein such processor stores magnetic event signal related data when a magnetic event signal is detected. As before, the processor may be connected to transmitter/receiver technology. The transmitter/receiver technology is used to transmit data between a remote station and the processor, such data including magnetic event signal related data and sensor output monitor programming data.

Additional embodiments of the present subject matter, not necessarily expressed in this summarized section, may include and incorporate various combinations of aspects of features, components, or steps referenced in the summarized objectives above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
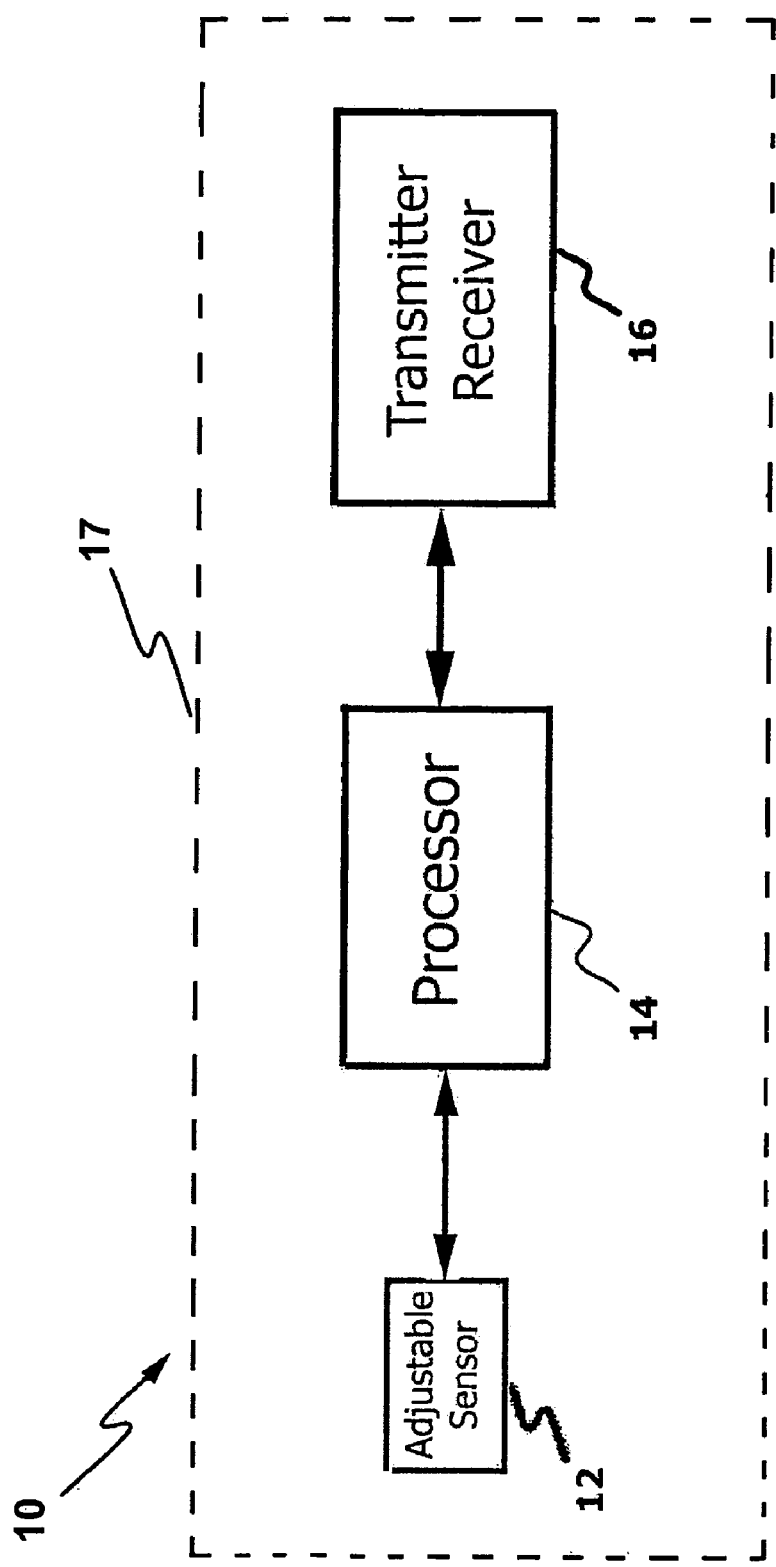
FIG. 1 is a block diagram illustration of an exemplary magnetic field sensing apparatus wherein the sensitivity of the magnetic field sensor is adjustable.

Repeat use of reference characters throughout the present specification and appended drawings is intended to represent same or analogous features or elements of the disclosed technology.

DETAILED DESCRIPTION OF EXEMPLARY EMBODIMENTS

As previously discussed, the present subject matter is particularly concerned with sensing magnetic fields in the proximity of a utility meter. The magnetic field sensing technology is adjustable to allow fine tuning of the sensing technology to compensate for variations in the level of ambient electromagnetic energy surrounding utility meters installed in different electromagnetic environments.

It should be noted that each of the exemplary embodiments presented and discussed herein should not insinuate limitations of the present subject matter. Features illustrated or described as part of one embodiment may be used in combination with aspects of another embodiment to yield yet further embodiments. Additionally, certain features may be interchanged with similar devices or features not expressly mentioned which perform the same or similar function. Reference will now be made in detail to the presently preferred embodiments of the subject interactive utility system.

Referring now to the drawings, FIG. 1 provides a block diagram illustration of an exemplary magnetic field sensing apparatus 10 wherein the sensitivity of the magnetic field sensor 12 is adjustable. One example of a magnetic field sensor in accordance with the present subject matter is a Hall cell device. The magnetic field sensor may be connected to a processor 14. For solid state or hybrid utility meters, processor 14 may be the microprocessor that controls the meter operation. Alternatively, in either solid state, electromechanical, or solid state/electromechanical hybrid (hereafter referred to as a hybrid utility meter) utility meters, processor 14 may be an application specific processor dedicated to monitoring and communicating with a magnetic field sensor. Processor 14 may also be connected to transmitter/receiver technology 16 for communicating with a remote location. Communications among utility meters and other devices in a utility system can be implemented using various technologies that are well known in the art. Both processor 14 and transmitter/receiver technology 16 may be incorporated within a utility meter 17. Utility meter 17 may be either a solid state meter, electromechanical meter, or hybrid utility meter.

In one preferred embodiment of the present magnetic field sensing technology, the sensitivity of the magnetic field sensor 12 may be either locally or remotely adjusted. Local adjustments would preferably be implemented using a hand held computing device capable of wired or wireless communication with a utility meter. For example, wired communications could be conducted over an optical port. Optical ports and related communication protocols are common to utility meters and such technology is well known in the art. In an exemplary embodiment, commands may be sent over the optical port to processor 14 and processor 14 would adjust the sensitivity of the magnetic field sensor. In the alternative, local magnetic field sensor sensitivity adjustments may be performed manually. Such adjustment, for example, may involve manually changing a magnetic field sensor sensitivity adjustment mechanism.

The magnetic field sensor sensitivity may also be adjusted remotely via a computing device at a remote location. In such embodiment of the present technology, magnetic field sensor adjustment commands are sent to the processor (14) from a remote location. The processor (14) would then make the necessary magnetic field sensitivity adjustments.

In this embodiment of the present technology, when a magnetic field sensor is subjected to a magnetic field of sufficient strength, depending on the sensitivity setting, the magnetic sensor activates. Notably, if a plurality of magnetic field sensors are used, each magnetic field sensor may have a unique sensitivity setting. For example, if four magnetic field sensors are used, then the first sensor may have a sensitivity of X, the second sensor a sensitivity of 2X, a third sensor a sensitivity of 3X and a fourth sensor a sensitivity of 4X. Now suppose two magnetic field events are recorded, call them event one and event two. During event one, only the first sensor and second sensor are activated. During event two, assume all four sensors were activated. Under these conditions, it is likely that the magnetic field detected during event two was at least twice as strong as the magnetic field detected during event one.

Another advantage of using a plurality of magnetic field sensors would be enhancing the ability of detecting magnetic fields in three-dimensions. For example, consider the commonly known representation for three-dimensional space configured by respective X, Y, and Z axes. A first magnetic field sensor could be orientated in a manner to optimize detecting magnetic fields along the X axis, a second magnetic field sensor could be orientated in a manner to optimize detecting magnetic fields along the Y axis, and a third magnetic sensor could be orientated in a manner to optimize detecting magnetic fields along the Z axis.

Referring still to the exemplary embodiment of FIG. 1, processor 14, monitors the output of each magnetic field sensor 12, detects the magnetic field sensor activation event and records magnetic field sensor activation related data. Magnetic field sensor activation related data may include the time, date, field strength, duration in time of magnetic field sensor activation, to name only a few. Once a magnetic field sensor activation event is detected and related data is recorded, the processor 14 may initiate communication with a computer at a remote location to report the event. Alternatively, processor 14 could report the magnetic field sensor activation related data during normally scheduled communications, such as would be common among AMR equipped utility meters.

Figure 2:
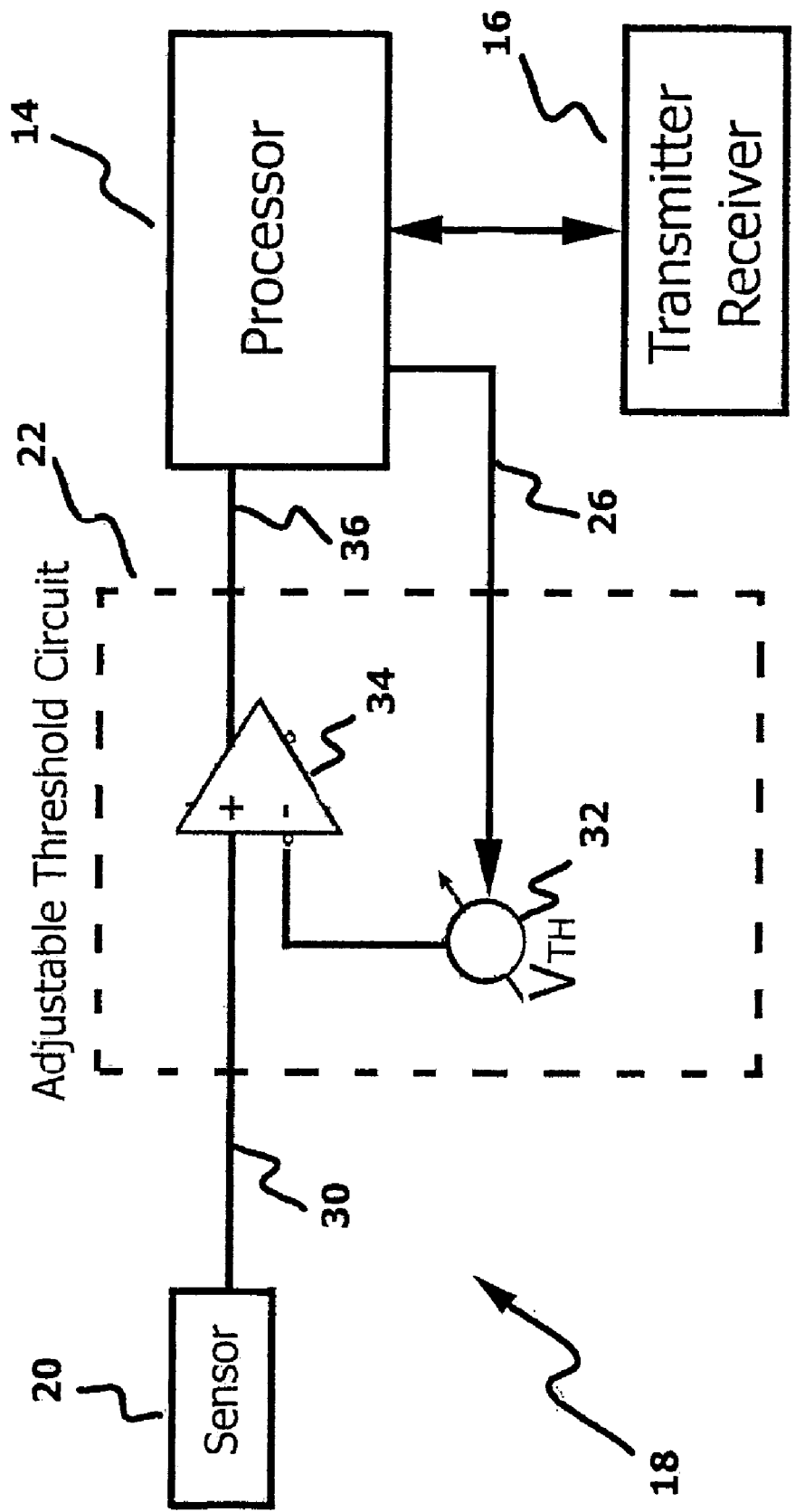
FIG. 2 is a block diagram illustration of an exemplary magnetic field sensing apparatus wherein the magnetic field sensor is connected to an adjustable threshold circuit.

With reference to another exemplary embodiment of the disclosed technology, FIG. 2 provides a block diagram of a magnetic field sensing apparatus 18 with an adjustable threshold circuit. In this embodiment, the output of magnetic field sensor 20, such as a hall cell, is connected to the input of an adjustable threshold circuit 22. The output of the adjustable threshold circuit 22 is connected to processor 14. The processor 14 is also connected to an adjustable threshold circuit adjustment mechanism 26. In addition, the processor 14 is also connected to transmitter/receiver technology 16. As described above, the transmitter/receiver technology is well known in the art.

It will be appreciated that FIG. 2 shows only one exemplary magnetic field sensor and one exemplary adjustable threshold circuit. A plurality of magnetic field sensors could be used and connected into a single adjustable threshold circuit without departing from the scope of this technology. Likewise, a plurality of magnetic field sensors may be connected to a plurality of adjustable threshold circuits.

Preferably, the output level of the magnetic field sensor 20 would be a function of the magnetic field being sensed. For example, the stronger the magnetic field around the magnetic field sensor 20, the greater the output voltage 30 of the magnetic field sensor 20. For this exemplary embodiment, when the output voltage 30 of a magnetic field sensor 20 exceeds the threshold voltage 32 inputted to comparator 34, the comparator output 36 would change states generating a magnetic event signal. It will be appreciated that other embodiments of the adjustable threshold circuit (such as logic devices other than comparators) may be used without departing from the scope of this technology. Processor 14 may also be connected to transmitter/receiver technology 16 for communicating with a remote location. Communications among utility meters and other devices in a utility system can be implemented using various technologies that are well known in the art.

The processor 14, preferably monitors the output of each adjustable threshold circuit. When a magnetic event signal is detected, the processor 14 records magnetic event signal related data. Magnetic event signal related data may include the time, date, field strength, duration in time of magnetic field sensor activation, and the threshold level, to name only a few. Once a magnetic event signal is detected and related data recorded, the processor 14 may initiate communication with a computer at a remote location to report the event. Alternatively, the processor 14 may report the magnetic event related data during normally scheduled communications, such as would be common among AMR equipped utility meters.

In one preferred embodiment of the present magnetic field sensing technology, the sensitivity of adjustable threshold circuit 22 may be either locally or remotely adjusted. Local adjustments would preferably be implemented using a hand held computing device wired or wirelessly interfaced to a utility meter port, such as an optical port. Optical ports and related communication protocols are common to utility meters and such technology is well known in the art. In an exemplary embodiment, commands may be sent over the optical port to the processor 14 and the processor 14 would adjust the sensitivity of adjustable threshold circuit 22. An exemplary adjustable threshold circuit 22 shown in FIG. 2 comprises a comparator with a programmable power source (the threshold voltage) connected to the inverting input of a comparator 34. A sensor output 30 is connected to the non-inverting input of the comparator 34. When the sensor 30 output voltage exceeds the threshold voltage, the comparator output 36 changes states, signaling the detection of a magnetic event.

In the alternative, local adjustable threshold circuit adjustments may be performed manually. Such adjustments, for example, may involve manually changing a threshold adjustment mechanism, such as turning a potentiometer. The sensitivity of adjustable threshold circuit 22 may also be adjusted remotely via a computing device at a remote location. In this embodiment of the present technology, adjustable threshold circuit adjustment commands are sent to the processor 14 from a remote location. The processor 14 would then make the necessary threshold adjustments.

When a plurality of magnetic field sensors are used, each sensor may have a unique threshold adjustment. As stated above with regards to FIG. 1, an advantage of using a plurality of magnetic field sensors would be enhancing the ability of detecting magnetic fields in three-dimensions.

Figure 3A:
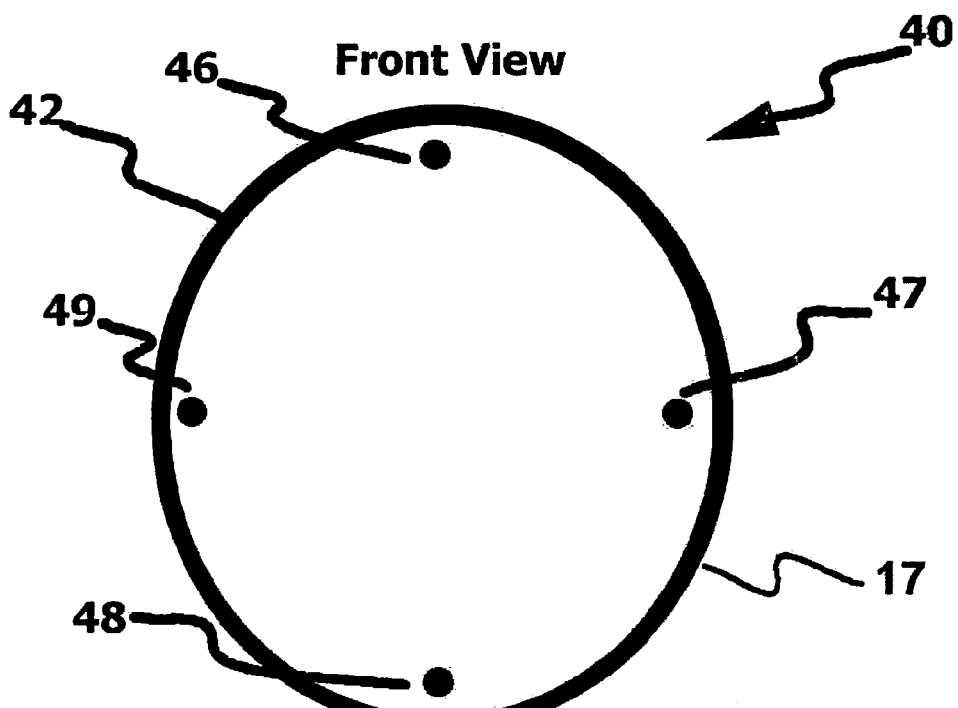
FIG. 3a is an illustration showing a front view of an exemplary utility meter including possible location of a plurality of magnetic field sensors.
Figure 3B:
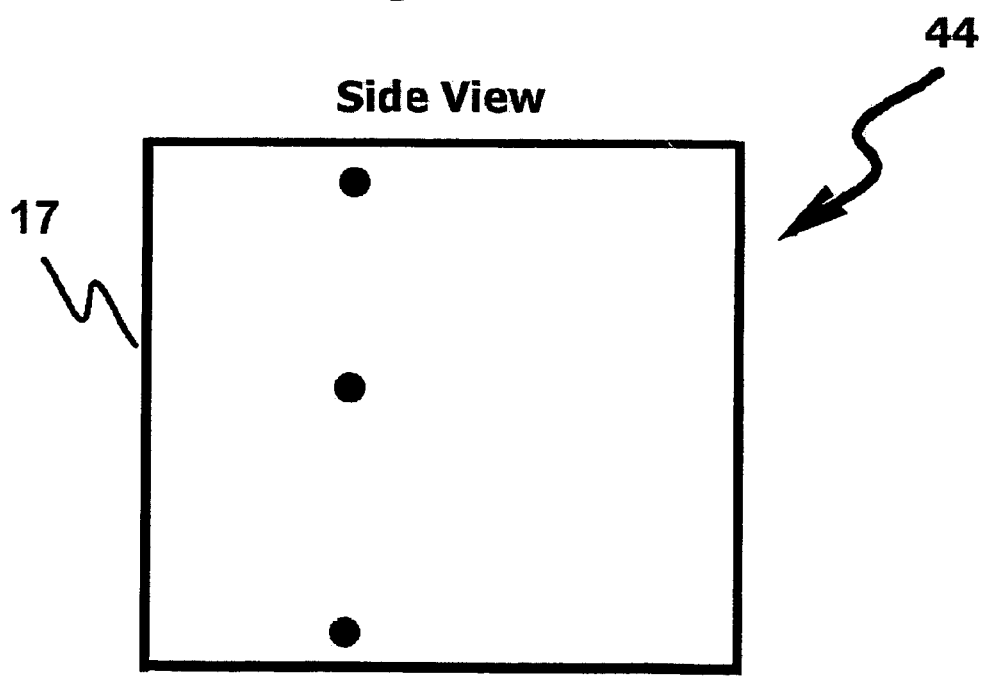
FIG. 3b is an illustration showing a side view of an exemplary utility meter including possible location of a plurality of magnetic field sensors.

With further references to the exemplary embodiments of the disclosed technology, FIG. 3a and FIG. 3b provide an illustration of the front view 40 and side view 44 of a utility meter with a plurality of magnetic field sensors (46, 47, 48, 49) located a various exemplary points within a utility meter.

Figure 4:
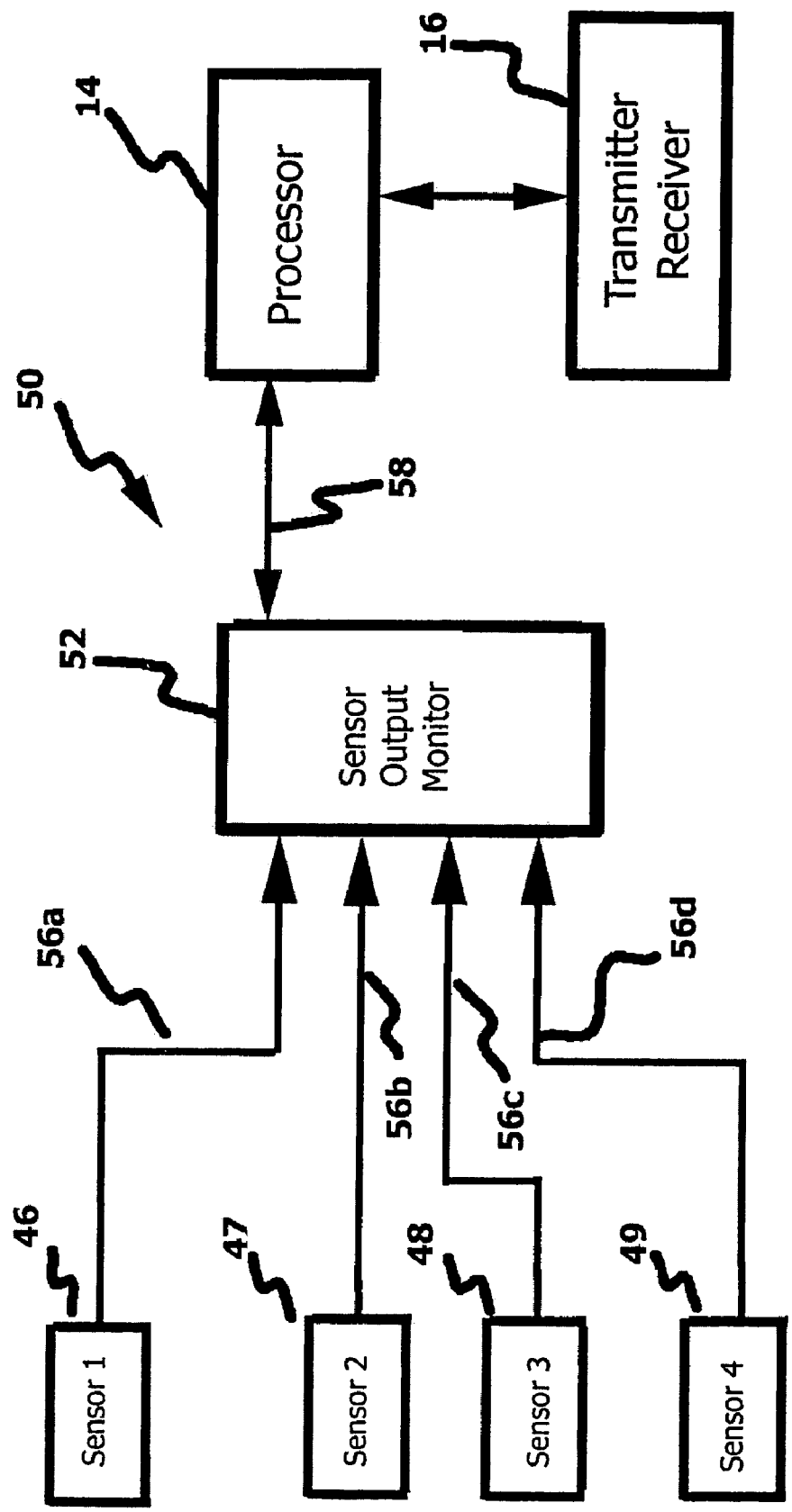
FIG. 4 is a block diagram illustration of an exemplary magnetic field sensing apparatus wherein a plurality of magnetic field sensors are connected to a sensor output monitor.

Referring now to FIG. 4, an exemplary magnetic field detecting apparatus 50 with a sensor output monitor 52 that may be used to adjust the selectivity of magnetic field detecting apparatus 50. For such embodiment of the disclosed technology, the sensitivity of magnetic field sensors 46–49, respectively, may or may not be adjustable. Preferably, the outputs 56a–56d, respectively, of each magnetic field sensor is connected to a sensor output monitor 52. The sensor output monitor is preferably connected to a processor 14, which may be connected to transmitter/receiver technology 16. Output monitor 52 may also be incorporated within processor 14.

The sensor output monitor 52 monitors the output of each magnetic field sensor 56a–56d. When a minimum number of magnetic field sensors have been activated, the sensor output monitor 52 generates a magnetic event signal 58. For example, as is well known by those of ordinary skill in the art, some meter designs allow activation of alternate modes of operation via activation of a magnetic switch. A technician may uses a hand-held magnetic to activate such alternate modes of meter operation. Such technician related activities do not represent a magnetic field meter tamper event.

Now suppose four magnetic field sensors (46, 47, 48, 49) are positioned inside utility meter 17 (as shown in FIG. 3a) and that activation of magnetic field sensor 46 evokes an alternative mode of operation. The sensor output monitor 52 may be programmed so that a magnetic event signal is generated only when the magnetic field sensors activated include sensor 49 and sensor 47. Thus, a magnetic field that activates only magnetic field sensor 46 would not result in a magnetic event signal being generated. A magnetic field that activates sensor 46, sensor 47 and sensor 49, would result in a magnetic event signal being generated. That is, when a programmable number of substantially simultaneously magnetic field sensor device activations is detected from, for example, sensors 46, 47, and 49.

Preferably, the processor 14 detects when the sensor output monitor 52 generates a magnetic event signal. When a magnetic event signal is detected, the processor 14 records magnetic event signal related data. Magnetic event signal related data may include the time, date, field strength, duration in time of magnetic field sensor activation, the threshold level (if any), to name only a few. Once a magnetic event signal is detected and related data recorded, the processor 14 may initiate communications with a computer at a remote location to report the event. Alternatively, the processor 14 may report the magnetic event related data during normally scheduled communications, such as would be common among AMR equipped utility meters.

In one preferred embodiment of the present magnetic field sensing technology, the sensor output monitor 52 is programmable or adjustable to facilitate changes in the selectivity parameter of the present technology. Such selectivity adjustments/reprogramming may be performed either locally or remotely. Local adjustments would preferably be implemented using a hand held computing device capable of communicating with a utility meter, such as communications over an optical port. Optical ports and related communication protocols are common to utility meters and such technology is well known in the art. In an exemplary embodiment, commands may be sent over the optical port to the processor 14 and the processor 14 would adjust or reprogram the selectivity of the sensor output monitor 52.

Alternatively, local hardware selectivity adjustments may be performed manually. Such adjustments, for example, may involve changing the states of a hardware switch. The The selectivity of sensor output monitor 52 may also be adjusted remotely via a computing device at a remote location. In such embodiment of the present technology, adjustment/reprogramming commands for sensor output monitor 52 are sent to the processor 14 within the utility meter from a remote location. The processor 14 would then make the necessary adjustments or implement the necessary reprogramming steps.

As before, a plurality of magnetic field sensors may be used, each sensor having a unique threshold adjustment. For example, magnetic field sensor 46, Shown in FIG. 3*a*, could be a plurality of magnetic field sensors. This cluster of magnetic field sensors could be in the general location of magnetic field sensor 46 shown in FIG. 3*a*.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for detecting magnetic fields within the proximity of a utility meter, comprising the steps of:
   (a) positioning at least two magnetic field sensor devices within the utility meter;
   (b) monitoring output of said at least two magnetic field sensor devices to detect when a magnetic field sensor device has been activated;
   (c) generating a magnetic event signal when a minimum number of substantially simultaneous magnetic field sensor device activations have been detected; and
   (d) storing magnetic event signal related data in a memory.

2. A method for detecting magnetic fields as in claim 1, further comprising the step of orienting said at least two magnetic field sensor devices in a manner to enhance the ability to detect magnetic fields in multiple dimensions with a specific number of magnetic field sensor device activations.

3. A method for detecting magnetic fields as in claim 2, further including the step of manually programming said sensor output monitor.

4. A method for detecting magnetic fields as in claim 2, further including the step of establishing a communications link between said processor and a remote computing device.

5. A method for detecting magnetic fields as in claim 4, further comprising the step of transferring magnetic event signal related data to said remote computing device.

6. A method for detecting magnetic fields as in claim 4, further including the step of programming said sensor output monitor according to programming instructions received from said remote computing device.

7. An apparatus for detecting magnetic fields within the proximity of a utility meter comprising:
   (a) at least two magnetic field sensor devices located within the utility meter;
   (b) a sensor output monitor associated with said at least two magnetic field sensor devices wherein said sensor output monitor is configured to detect when a magnetic field sensor device has been activated;
   (c) wherein said sensor output monitor is further configured to generate a magnetic event signal when a programmable number of substantially simultaneous magnetic field sensor device activations is detected;
   (d) a processor associated with a memory and said sensor output monitor; and
   (e) wherein said processor is configured to store magnetic event signal related data in said memory when a magnetic event signal is detected.

8. An apparatus for detecting magnetic fields within the proximity of a utility meter as in claim 7, wherein said at least two magnetic field sensor devices are oriented in a manner to enhance their collective ability to detect magnetic fields in multiple dimensions.

9. An apparatus for detecting magnetic fields within the proximity of a utility meter as in claim 7, wherein said utility meter is one of a solid state meter, an electromechanical meter, and a solid state/electromechanical hybrid meter.

10. An apparatus for detecting magnetic fields within the proximity of a utility meter as in claim 7, wherein said programmable number is manually programmable.

11. An apparatus for detecting magnetic fields within the proximity of a utility meter as in claim 7, further comprising a transmitter/receiver associated with said processor, wherein said processor is configured to use said transmitter/receiver to communicate with a remote computing device.

12. An apparatus for detecting magnetic fields within the proximity of a utility meter as in claim 11, wherein said processor transfers at least part of said magnetic event signal related data to a remote computing device.

13. An apparatus for detecting magnetic fields within the proximity of a utility meter as in claim 12, wherein magnetic event signal related data includes at least one of (a) a time-stamp noting when a magnetic event signal started, (b) a time-stamp noting when a magnetic event signal stopped, (c) date of magnetic event signal generation, (d) the field strength of the magnetic field associated with the magnetic event signal, (e) duration in time of magnetic event signal generation, and (f) said programmable number value.

14. An apparatus for detecting magnetic fields within the proximity of a utility meter as in claim 11, wherein said processor is configured to set said programmable number to a value received from a remote computing device.

* * * * *